United States Patent [19]
Archer

[11] 4,364,047
[45] Dec. 14, 1982

[54] CONTROL LEVER SWITCH

[75] Inventor: Michael A. Archer, Norderstedt, Fed. Rep. of Germany

[73] Assignee: Firma Jungheinrich Unternehmensverwaltung KG, Hamburg, Fed. Rep. of Germany

[21] Appl. No.: 171,039

[22] Filed: Jul. 22, 1980

[30] Foreign Application Priority Data

Aug. 3, 1979 [DE] Fed. Rep. of Germany ....... 2931489

[51] Int. Cl.³ .................... G08C 19/10; A61C 19/04
[52] U.S. Cl. ............................ 340/870.37; 361/288; 200/DIG. 1; 200/6 A; 318/55
[58] Field of Search ................. 361/288; 307/116; 200/181, DIG. 1, 6 A; 180/6.5, DIG. 3; 318/16, 139, 53, 55, 51; 340/365 C, 870.37

[56] References Cited
U.S. PATENT DOCUMENTS

| | | | |
|---|---|---|---|
| 2,340,213 | 1/1944 | Ellsworth | 84/DIG. 7 |
| 3,814,199 | 6/1979 | Jone | 180/6.5 |
| 4,245,137 | 1/1981 | Hirai et al. | 200/6 A X |

*Primary Examiner*—Ulysses Weldon
*Attorney, Agent, or Firm*—Toren, McGeady & Stanger

[57] ABSTRACT

A control lever switch for providing steplessly adjustable control values, e.g. directional commands, for a plurality of outputs is based upon the provision of a number of electrodes in a spaced array around a control lever, these electrodes being capacitively coupled to a transmitter electrode which is carried by the control lever and which is adjustable via the control lever both radially and circumferentially of the electrode array. Preferably, four 90° segment electrodes are provided, with a circular gap in the center, appropriately connected to two output channels to give, in a vehicle control system, both directional control and speed control in each channel. The electrode array and the transmitter electrode may be provided on respective opposite sides of a circuit board over which the transmitter electrode can slide easily. The control lever switch permits one-hand control of vehicles, such as wheelchairs, of model aircraft and boats, and of quadrophonic sound systems for example, just by tilting and turning the control lever.

12 Claims, 8 Drawing Figures

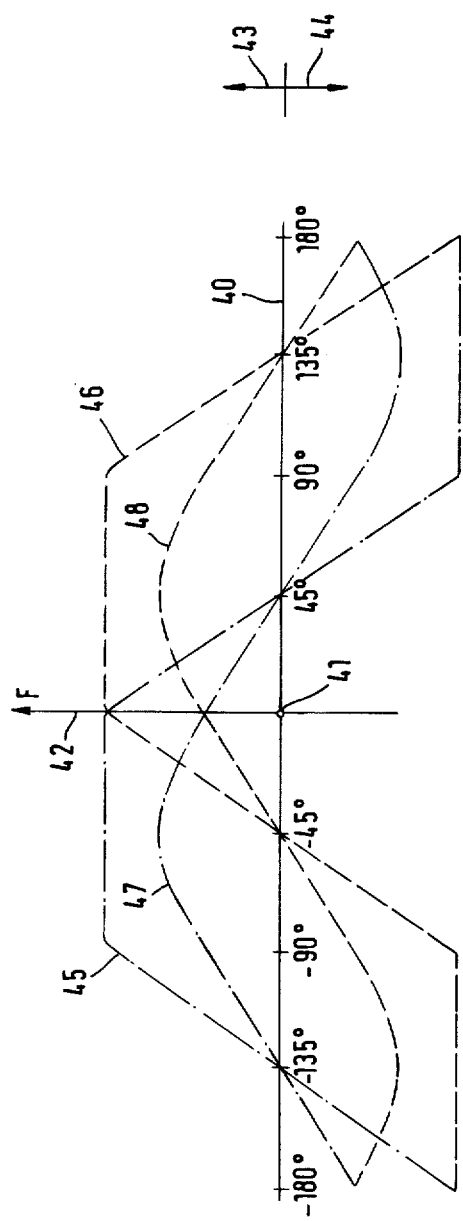
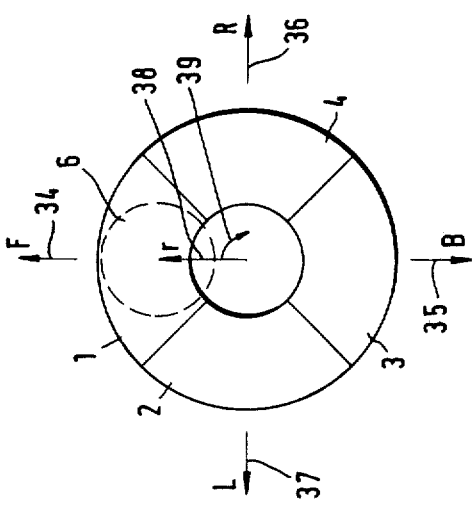
Fig.5

CONTROL LEVER SWITCH

FIELD OF THE INVENTION

This invention relates to a control lever switch for providing steplessly adjustable control values for a number of switch outputs, particularly directional control values, in which the output and the value dimensions are selectable by a single-handed operation and associated with the control lever are adjustable electrical elements to which control channels are connected.

The invention is primarily concerned with a single-hand control column switch which, when moved, being both adjustable through 360° and also movable in the radial direction, can give control of different outputs, and by means of which, additionally, varying signal magnitudes can be produced in dependence upon the setting of the control lever in the circumferential direction and in dependence on its degree of tilt.

DESCRIPTION OF THE PRIOR ART

Such control lever switches have until now been designed as potentiometer switches. Depending upon the tilt of the control lever, potentiometers are adjusted and the resulting variable currents or voltages are processed in electronic amplifying circuits in order to produce control commands.

It is true that such potentiometric switches do function adequately in an as-new condition in respect of the uniformity of change in the control commands, but they have the disadvantage of a limited life and are subject to varying influences during their working life, since potentiometers work with sliding contacts which are subject to wear, with the result that this can lead to undesirable results, and above all to an impairment of the control accuracy.

Applications for such control lever switches include for example vehicle controls, especially controls for wheelchairs with electric battery drive, where the vehicle has for example two drive motors, each of which constitutes a unilateral drive. Thus, one preferred use of such control lever switches is in wheelchair control. The control lever switch can also be used for the control of model aircraft, model boats and the like, and for example also with the aforementioned outputs being used to control four-channel amplifiers in quadrophonic sound systems in which main and auxiliary loudspeakers have to be balanced to a greater or lesser degree in one of the side channels.

SUMMARY OF THE INVENTION

It is an object of the present invention to provide an improved control lever switch of the type first mentioned above, improved in such a way that in respect of the electrical elements these are contactless, that steplessly adjustable control commands for a plurality of directions are available, and with it being possible by a single-handed operation to select a combination of particular elements to produce desired signals.

This is achieved in accordance with the present invention in that capacitively controllable electrodes are provided which are arranged in a spaced array around the control lever when located in its rest position, the control lever carrying a transmitter electrode which is adjustable both in the circumferential direction of the array and also radially in relation to the electrodes. By virtue of the capacitive coupling in the control lever switch one obtains a contact-free coupling between the co-operating elements. From this, by an appropriate arrangement and shape of the electrodes, one can produce particular characteristics.

According to a preferred arrangement, the capacitively controllable electrodes are arranged on one side of a circuit board, with the transmitter electrode bearing directly against the other side of the board. This results in a robust switch unit which is practically trouble-free, since the circuit board is thus not only the carrier for the capacitively controllable electrodes but simultaneously bears the transmitter electrode, so that capacitive couplings defined therebetween are achievable. Preferably, the circuit board is made of a wear-resistant material which is suitable as a dielectric and has good sliding properties for the movement of the transmitter electrode which is pressed resiliently against it. By making the transmitter electrode easily slidable on the circuit board one achieves an adjustable switch which is highly sensitive.

It is of particular advantage if the circuit board is made of glass-fibre-reinforced epoxy resin, and if a lubricant, particularly a silicone grease, is provided on that side of the circuit board against which the transmitter electrode bears. In this way frictional resistance is eliminated or at least severely reduced, although it is also still preferable for the edges of the transmitter electrode to be rounded.

It is particularly advantageous if arcuate segment-shaped electrodes are provided and if a gap which is substantially the same size as the transmitter electrode is left in the centre of the electrodes on the axis of a bearing for the control lever. The segmental arrangement leads additionally to well-defined shapes, since a narrow gap is left between each pair of electrode edges which extend in the radial direction. These radial gaps preferably have the same width from the inside to the outside of the electrodes, although this does not exclude the possibility that the shape of the gaps could vary over the radial length of the gap in order to superimpose a particular characteristic by varying the gap width.

Also, the use of segmental electrodes means that two, three, or even more than four electrode sectors could be provided. One preferred arrangement consists of an arrangement of four segmental electrodes. These four electrodes are preferably used with electronic remote controls or for vehicle controls operated by one hand. With just four electrodes it is possible to combine pairs of the signal amplitudes obtained from the electrodes in order to achieve both a trouble-free directional control and also speed control for the direction in which one wishes to turn.

In a preferred embodiment of the control lever switch the transmitter electrode is disc-shaped and is arranged to be pivotable and axially displaceable on the adjacent end of the control lever by means of an electrically insulating sleeve-type guide, with a spring being provided to urge the transmitter electrode against the circuit board. This ensures that the disc-shaped transmitter electrode can be moved parallel to each of the segmental electrodes.

With control lever or control knob switching it is known to make the control lever universally pivotable by mounting it in a spherical bearing. This is appropriate for the present invention. Preferably, directly in connection with the capacitive coupling, a spring arrangement is provided between a bearing block for the spherical bearing and a spring seat on the control lever, the spring arrangement tending to hold the control lever in a middle position. The spring arrangement can conveniently consist of a coil spring.

According to another preferred feature of the invention, a sleeve is displaceable on the control lever and also serves as a seat for the coil spring, with the flat face of the sleeve which is adjacent to the spherical bearing being movable over an opposed flat section of the bearing block, with the result that the coil spring is compressible in dependence upon the amount of the tilt of the control lever. This means that by simple means one ensures that even upon tilting the control lever one has constant guidance of the disc-shaped transmitter electrode against the circuit board.

According to a simple embodiment of the last-mentioned feature, a cylindrical shoulder is preferably provided on the sleeve to project into the coil spring and to be movable into contact with the spring seat to constitute a stop and to limit the lateral tilt of the control lever. Preferably, the spring seat is additionally a seat for a further spring which is weaker than the coil spring and which is seated at its other end against the sleeve-shaped guide.

Preferably, an alternating voltage is applied to the disc-shaped transmitter electrode and control channels are connected to the segmental electrodes, these channels producing directional signals in subsequent circuitry corresponding to fractions of the number of segmental electrodes, and these directional signals being affected in magnitude by the tilting of the control lever.

A control lever switch for the type of vehicle control mentioned above having two drive motors each of which constitutes a unilateral drive would have in accordance with one particularly preferred embodiment the connection of four segmental electrodes to two control channels which each have both a variable amplitude DC output and also a directional output.

BRIEF DESCRIPTION OF THE DRAWINGS

A presently preferred embodiment of control lever switch will now be described by way of example and with reference to the accompanying drawings.

In the drawings:

FIG. 5 shows signal patterns for the preferred four-electrode arrangement of switch in conjunction with the illustrated circuit elements;

DESCRIPTION OF THE PREFERRED EMBODIMENT

First of all, an embodiment of control lever switch will be described with reference to FIGS. 1 and 2 in which a switch is shown having four arcuate segment-shaped electrodes 1 to 4 on the undersside of a circuit board 5. Four electrodes is a preferred arrangement. Basically, any number of n fixed electrodes is possible, these being defined by copper surface areas on the circuit board 5 which is printed on one side. The exact number, shape and size of the electrodes 1 to 4 depends upon the desired output characteristics.

Figure 1:
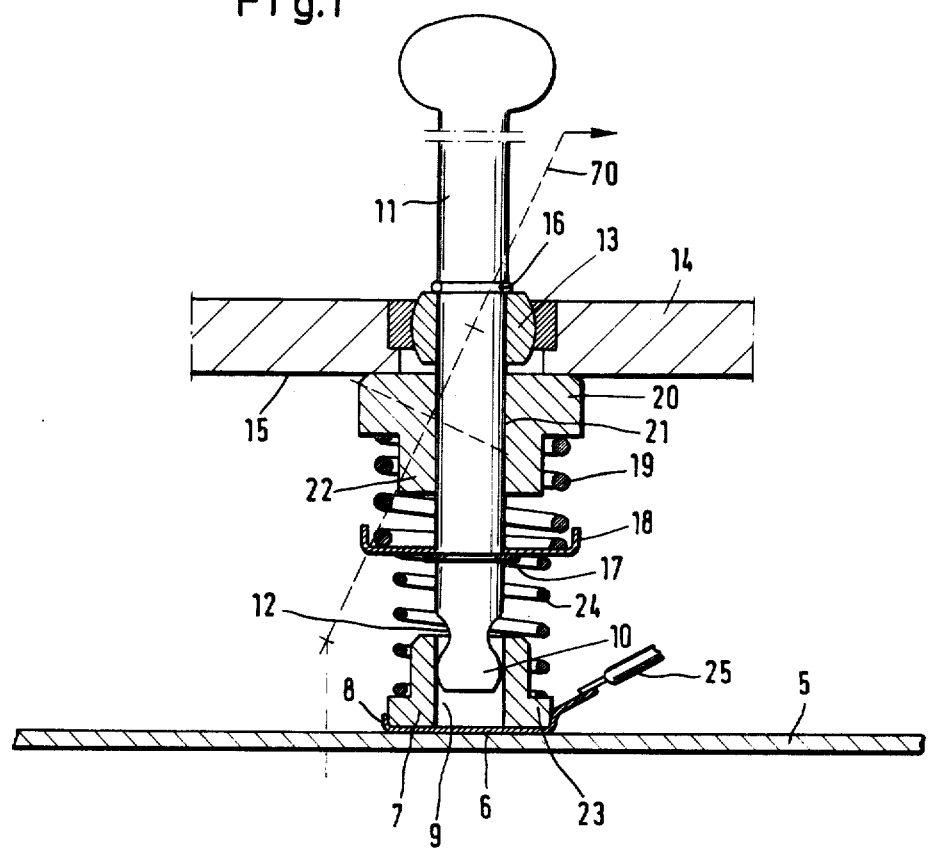
FIG. 1 is a schematic side view of the control lever switch.

On the side of the circuit board 5 which is shown as the upper side in FIG. 1, and remote from the electrodes 1 to 4, there bears a transmitter electrode 6 set flat against the surface. This transmitter electrode 6 is formed in practice as a metal disc which is arranged on the underside of an electrically insulating, sleeve-type guide 7. An upturned rim 8 is provided around the edge of the underside of this sleeve-type guide 7.

The sleeve-type guide 7, which is made of an electrically insulating material, has a central bore 9. A part-spherical foot 10 of a control lever 11 projects into this bore 9 and is axially displaceable and pivotable therein. Between the foot 10 and the stem of the control lever there is a circumferential groove 12 so that a pivotal movement of the lever at the upper margin of the sleeve-type guide 7 is possible even when the guide is displaced laterally.

The control lever 11 is mounted in a spherical bearing 13 which is arranged in a bearing support 14. Around the region of the spherical bearing 13 this bearing support 14 has a flat section 15 which extends parallel to the upper surface of the circuit board 5. Above the bearing housing of the spherical bearing 13 a circlip 16 is provided in a groove in the control lever as a stop and to limit the downward movement of the control lever in the direction towards the circuit board 5.

A spring seat 18 is mounted beneath the bearing support 14 on a circlip 17 so as to encircle the stem of the control lever, and a strong coil spring 19 is arranged to have its lever end resting on the seat 18. The other end of the coil spring 19 is seated against a sleeve 20 made for example of a material going by the generic name of nylon. This sleeve 20 has a central bore 21 and is displaceable on the stem of the control lever. It is urged by the strong coil spring 19 against the flat section 15 of the bearing support 14, so that the control lever is maintained in its middle position by the force of the spring.

When the control lever is tilted, as is indicated for example by the broken line 70, moving the transmitter electrode 6 laterally, the coil spring 19 is compressed, and the counter pressure increases with an increasing degree of tilt. A maximum degree of tilt is defined by virtue of the fact that the sleeve 20 has a cylindrical shoulder 22 projecting into the coil spring 19 and which with increasing tilt moves closer towards the spring seat 18, until eventually by contact with the spring seat 18 it prevents further tilt of the control lever in the radial direction.

It will be appreciated that the sleeve 20 and the flat section 15 of the bearing support 14 could be made of a material which permits the parts to slide easily on one another, possibly a lubricated material.

Between the sleeve-type guide 7, which has an outwardly projecting step 23, and the spring seat 18 there is arranged another, weaker coil spring 24 which holds the disc-shaped transmitter electrode 6 always flat against the circuit board 5.

It can be seen that the transmitter electrode 6 is connected to a voltage supply by a flexible wire 25. It should also be pointed out that the segment-shaped electrodes 1 to 4 are also each provided with electrical connections which are not shown in FIG. 2.

Figure 2:
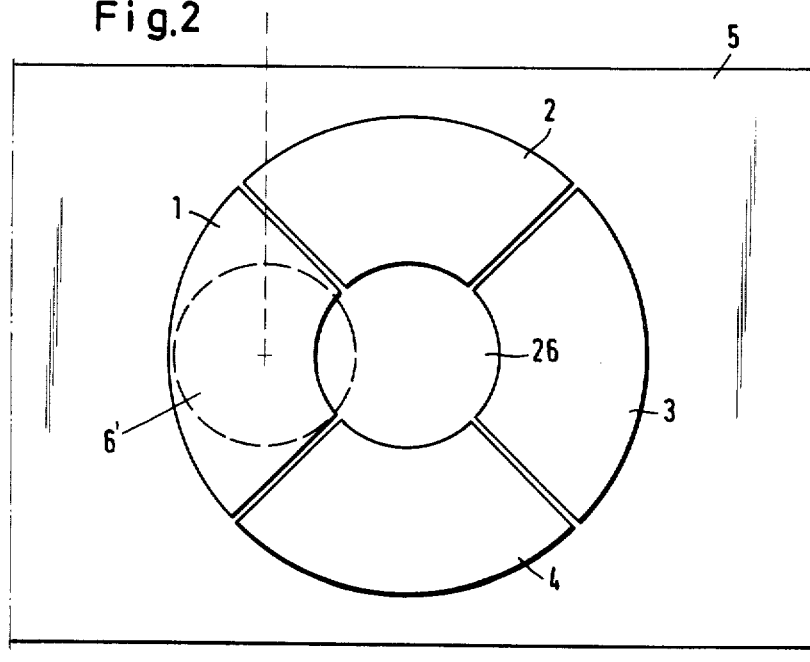
FIG. 2 is a view of the switch of FIG. 1 from below, but in which only the segmental electrodes are primarily shown.

Having regard to the displacement of the transmitter electrode 6 indicated by the broken line 70, it is evident from FIG. 2 that the transmitter electrode can be displaced into a position 6' in which it is only coupled to electrode 1. Furthermore, it can be seen that with the electrodes 1 to 4 there is a central gap 26 which essentially corresponds both in size and shape to the transmitter electrode 6.

Figure 3:
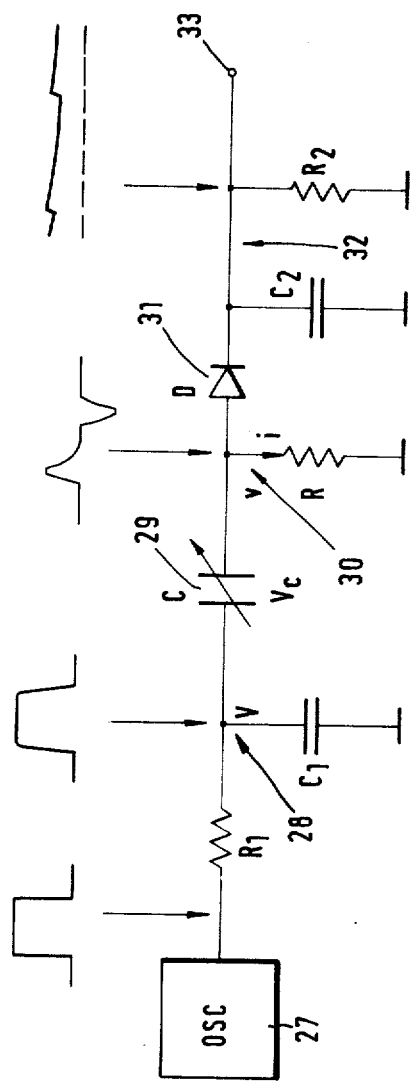
FIG. 3 is a schematic circuit diagram illustrating the generation of control signals with the control lever switch.

In order to explain the operation of this preferred embodiment reference is now made to suitable circuit arrangements. FIG. 3 shows a signal source 27 comprising a squarewave oscillator above which the square waveform which it generates is shown. An integrating circuit 28 comprising resistance $R_1$ and capacitance $C_1$ is connected at the output side of the oscillator and by means of this the signal flanks are shaped. The control lever switch is connected to the output of this integrating circuit with a capacitative coupling which is here shown as a variable capacitance 29. Following this there is a resistance R having one side connected to ground. This resistance R forms, with the variable capacitance C, a differentiating circuit 30 in which the signal shown above the circuit is produced. This signal is fed to a diode 31 which detects the peak amplitude of the signal passing through it. The subsequent circuit 32 comprising a capacitance $C_2$ and a resistance $R_2$ constitutes a filter for supplying a DC output signal to an output terminal 33. This rectified and smoothed signal is shown in FIG. 3 above the resistance $R_2$.

The signals which are present at the points 28,29 and 30 are indicated by the letters V, $V_c$ and v respectively. This gives:

$$V = f \cdot t$$

$$v = V - V_c = iR$$

$$V_c = \frac{i}{c} \int i dt$$

$$f \cdot t - \frac{i}{c} \int i dt - iR = 0$$

From this one can establish that the relationship between the differentiating circuit and a shaped pulse input is given by the equation:

$$v = k \, CR(1 - e^{-t/CR})$$

where k is a constant which depends upon the gradient function.

Figure 4:
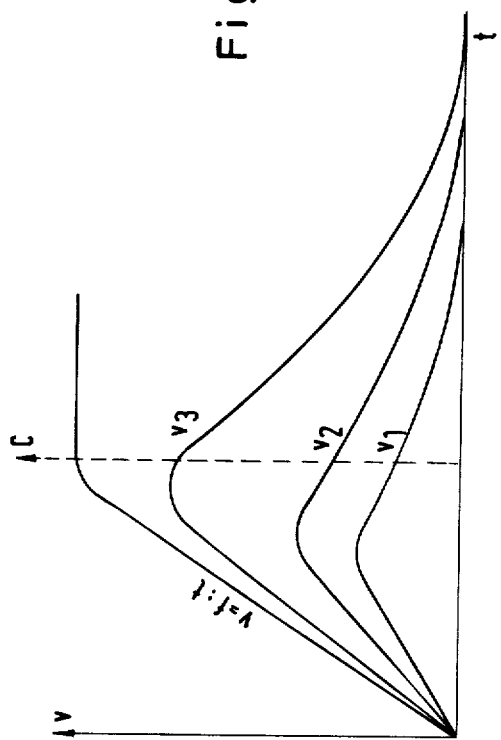
FIG. 4 is a graphical illustration of the dependence of the signals on the changes in the capacitive coupling.

The graphical plots shown in FIG. 4 show that the signal v varies in dependence upon the capacitive value of C. The peak amplitude which is detected by the diode 31 is therefore proportional to C. For the DC output signal at 33 one has $$t > 2.3 \, CR \quad e^{-t/CR} < 0.1$$
$$\rightarrow v \sim kRC$$

i.e. the output voltage at 33 is directly proportional to C, and the magnitude of the latter is directly related to the area of overlap between the transmitter electrode 6 and the receiver electrodes 1 to 4.

FIG. 5 shows the resulting signal pattern in relation to the illustrated example having the four electrodes 1 to 4 and the transmitter electrode 6.

In relation to the illustration shown in FIG. 5, it is pointed out that the arrow 34 represents, for vehicular control for example, a forward direction of travel, the arrow 35 the reverse direction, the arrow 36 a movement to the right and the arrow 37 a movement to the left. The tilting of the control lever and the consequent movement of the transmitter electrode 6 is effected in the direction of the radius 38 together with the possibility of a rotation either to the right or to the left in accordance with the arrow 39.

It will be appreciated that the superimposition of the transmitter electrode 6 on the other electrodes as the transmitter electrodes moves in the different directions is as follows:

In the forward direction: electrode 1
In the reverse direction: electrode 3
In the direction to the right: electrode 4
In the direction to the left: electrode 2

With a vehicle drive system having two lateral motors, the left lateral motor drive must drive faster that the right motor for a change of course in the forward direction to the right. Consequently, two control channels result from this. The channel for change of course to the right is given by electrodes $1+2-(3+4)$ and the channel for change of course to the left is given by electrodes $1+4-(2+3)$.

The signals which result from this are illustrated in the upper part of FIG. 5. The diagram has an abscissa 40 which extends from a central zero point at 41 to give deflections both to the right and the to the left up to 180°, and has an ordinate 42 which corresponds to the forward direction arrow 34 and represents the signal amplitude. Thus, in relation to the embodiment shown in FIG. 3 which has a square-wave oscillator as the source 27, it is pointed out that signals which are directed upwardly above the abscissa 40 in the direction of the arrow 43 are in phase with the signal source, while those signals which extend below the abscissa in the direction of the arrow 44, which is representative of the rearward direction, are of opposite phase to the signal source. Directional magnitudes can be derived from this.

FIG. 5 shows the two signals referred to above for the two control channels for change of course to the right and for change of course to the left with different radial deflection of the transmitter electrode 6. The curve 45 represents the path of the control signal for the channel for change of course to the right, while curve 46 represents the path of the signal for change of course to the left, the transmitter electrode 6 in each case being deflected to its maximum radius. The curves 47 and 48 correspond to the control channels having the curves 45 and 46, but here with a deflection of the transmitter electrode 6 to a smaller radius, for example to a radius which corresponds to approximately half the maximum radius.

From the illustration shown in FIG. 5 it can be appreciated that one has proportional control with smooth transitions, and with the path of the characteristic being adjustable by the amount of radial tilt given to the control lever.

Figure 6:
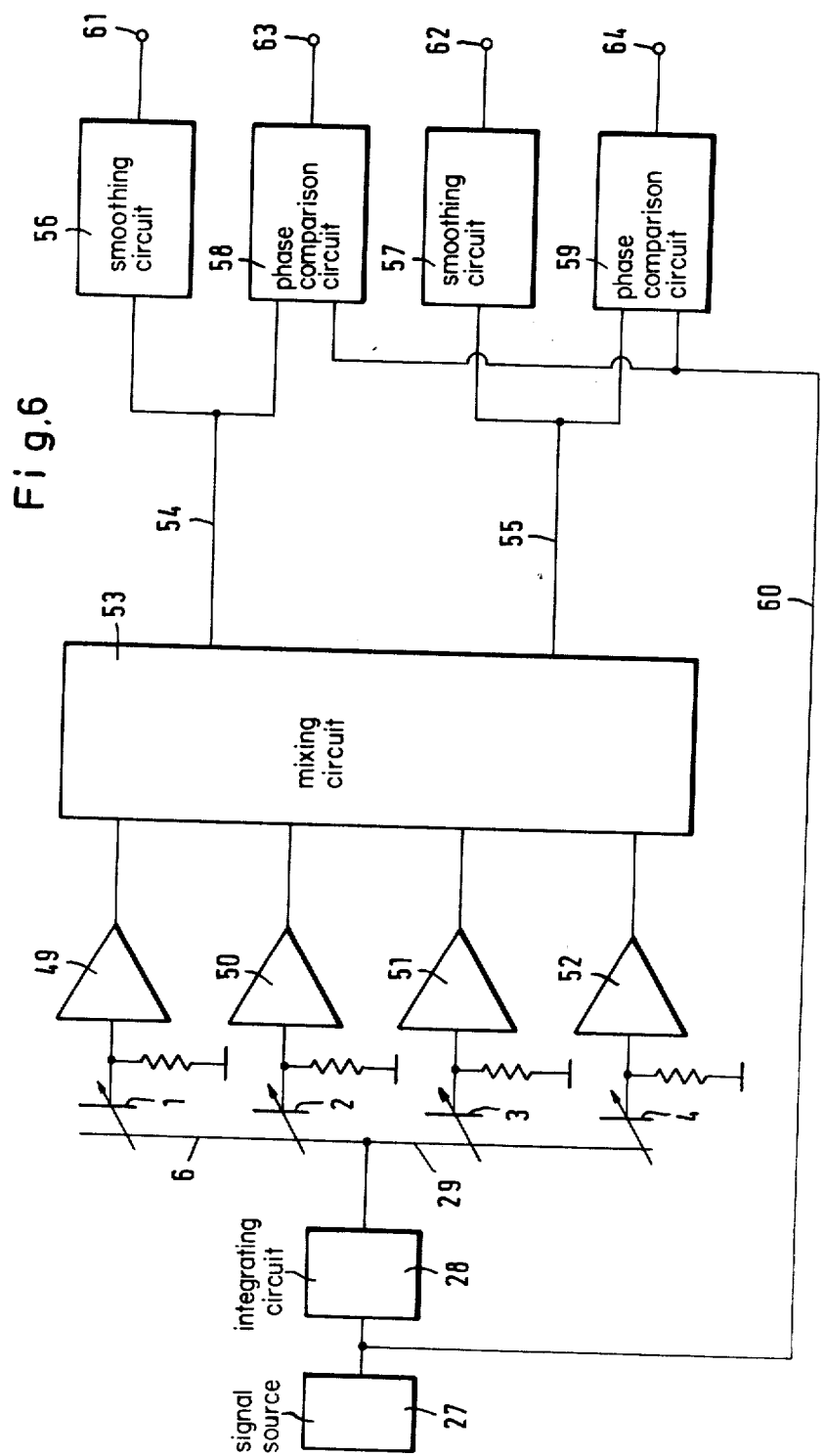
FIG. 6 is a block diagram for the capacitive coupling with four segmental electrodes for the establishment of two outputs.

FIG. 6 is a block schematic diagram in which those elements which are the same as in FIG. 3 are indicated by the same reference numerals. Thus, it will be appreciated that the capacitor, i.e. the control switch, has the transmitter electrode 6 associated with all the segmental electrodes 1 to 4. The electrodes 1 to 4 are the already described resistances and are followed each by a buffer amplifier 49 to 52. The output signals are fed to a mixing circuit 53 for supplying the two channels, channel 54 being the aforementioned channel for change of course to the right and channel 55 being the aforementioned channel for change of course to the left. The signals in the respective channels are each fed to a rectifying and smoothing circuit 56, 57 and to a phase comparison circuit 58, 59. For the purpose of phase comparison the phase comparison circuits 58, 59 each have a connection 60 to the source 27. From the rectifying and smoothing circuits 56, 57 one obtains a DC output signal 61, 62, and from the phase comparison circuits 58, 59 one obtains a directional output signal 63, 64, the numbers indicating the output terminals at which these output signals appear. The directional output signals can energise relays for example, in order to control the direction of rotation of motors. The DC output signals control the speed of rotation of the motors.

Figure 7:
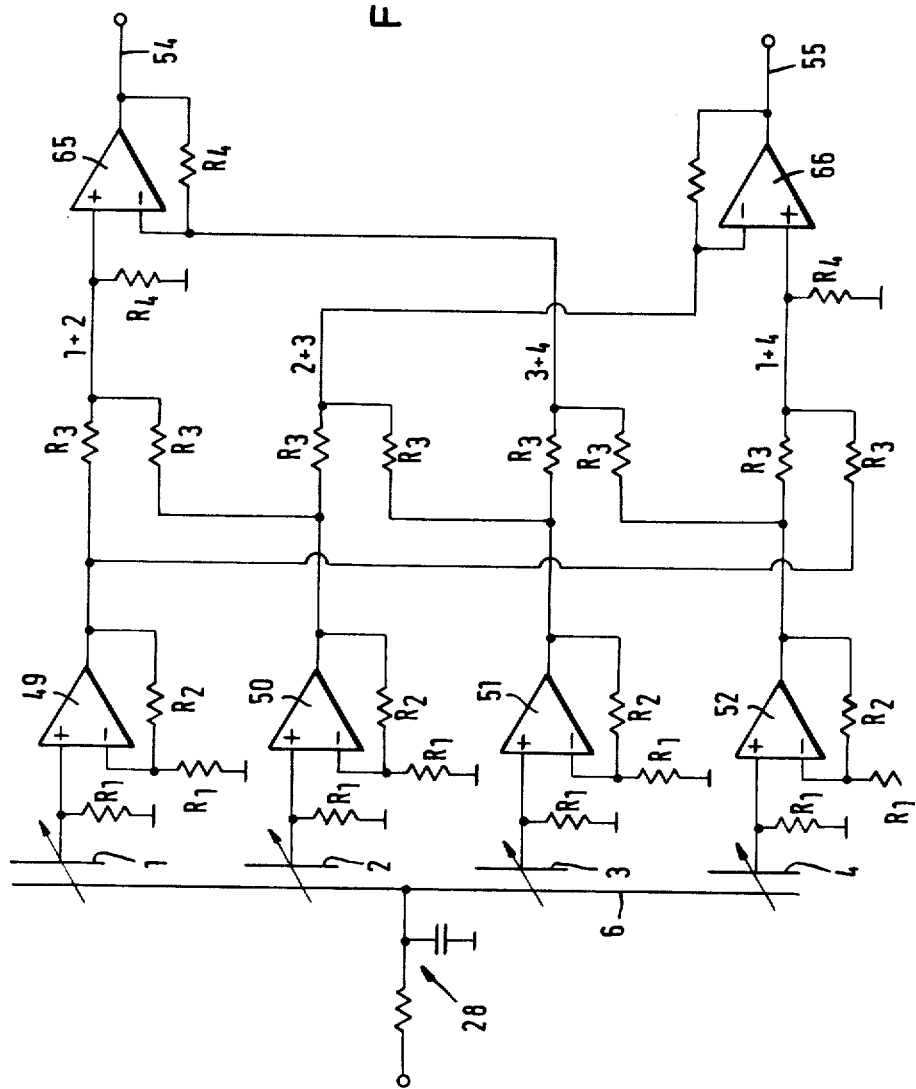
FIG. 7 shows the basic outline of a suitable form of circuit.

FIG. 7 shows a preferred embodiment of circuit in which, for simplification, the same reference numbers are again used as have been used in the preceding Figures. Thus, it will be appreciated that each of the electrodes 1 to 4, the so-called receiver electrodes, have the same load, indicated by $R_1$. The buffer amplifiers with their associated resistances $R_2$ supply, from the electrodes, signals which are indicated in the areas above the respective electrical leads to a mixing stage comprising two differential amplifiers 65, 66 in which a total of four signals are mixed together and an output signal for each channel is produced. From there one treats the channels 54 and 55 as in FIG. 6, for example.

Figure 8:
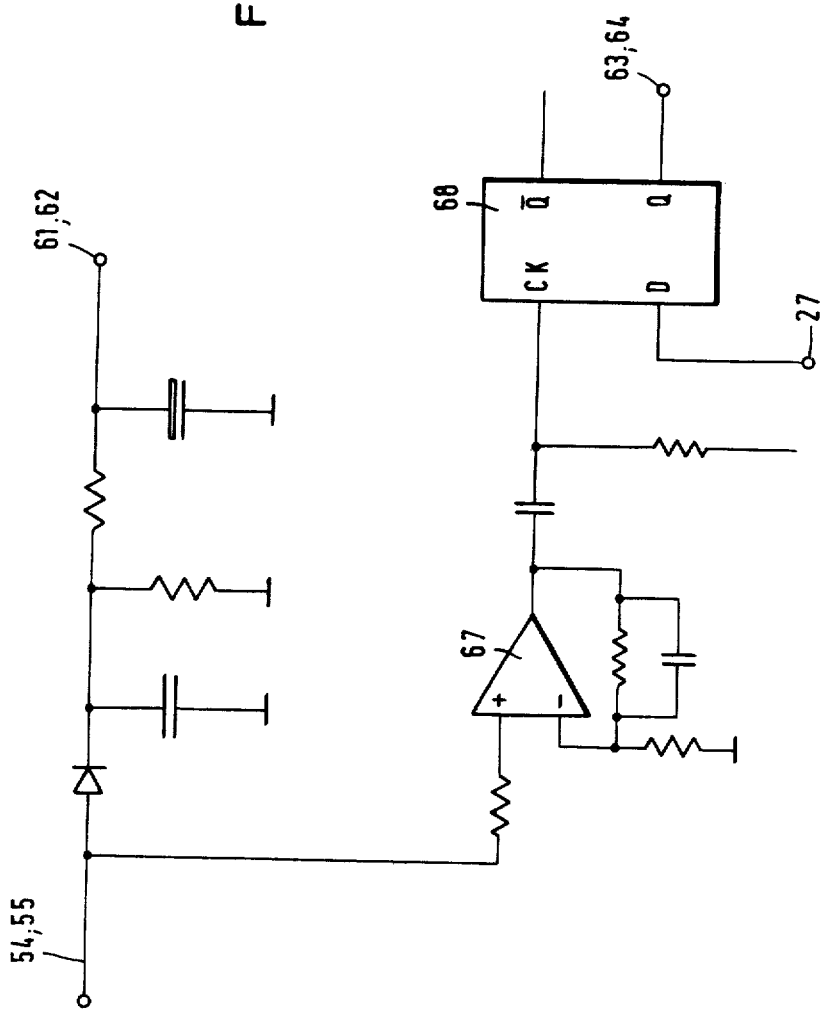
FIG. 8 is a circuit detail illustrating the formation of a control channel.

For the sake of completeness reference is now made to FIG. 8. This FIG. 8 is illustrative of only one of the channels, 54 or 55, and shows a smoothing circuit for the DC output signal at 61 or 62 and the supply of the directional output signal at 63 or 64. Thus, in advance of the outputs at 63 and 64 there is provided a signal amplifier 67 followed by a phase detector 68. This phase detector 68 comprises a flip-flop circuit circuit of D-type which compares the oscillator signal with the output signal from the mixer stage after amplification.

The signal amplifier 67 is necessary in order to provide a good cycle pulse for a mixer output signal with small amplitude. Cx ensures that the CK pulse lags behind the D pulse from the oscillator 27. The signal at D is transferred to Q when instructed by the CK pulse, where it is maintained, which means that the CK pulse changes in phase with reference to the oscillator.

As shown, the signal at outputs 63, 64 for the forward direction has a large height or amplitude and for the rearward direction has a small height or amplitude. Consequently, this constitutes a practical circuit arrangement.

I claim:

1. A control lever switch for providing steplessly adjustable control values for a plurality of switch outputs, particularly directional commands, which are adjustable by means of the control lever switch, in which output signals can be selected both in respect of direction and magnitude by single-handed operation of a control lever, the switch comprising a control lever, bearing means in which the control lever is mounted for universal pivoting movement, a transmitter electrode carried by the control lever, control electrodes arranged in a spaced array around the control lever and its transmitter electrode when located in their rest position, a circuit board on one side of which said control electrodes are provided and against the other side of which said transmitter electrode bears directly such that a capacitive coupling is obtained between said control electrodes and the transmitter electrode, the transmitter electrode being adjustable both radially relative to said control electrodes and circumferentially of the array, output control channel means connected to said electrodes, and input energising means connected to the transmitter electrode.

2. A control lever switch as claimed in claim 1, wherein the circuit board is made of a wear-resistant material which acts as a dielectric and on which the transmitter electrode is able to slide easily.

3. A control lever switch as claimed in claim 2, in which the circuit board is made of glass-fibre-reinforced epoxy resin and has lubricating means, paticularly a silicone grease, provided on said other side against which the transmitter electrode bears.

4. A control lever switch as claimed in claim 2, in which said control electrodes are arranged as segments circumferentially around the control lever and have a central gap substantially equal in size to the size of the transmitter electrode and on the axis of said bearing means.

5. A control lever switch as claimed in claim 4, comprising four such segmental electrodes with radial dividing slots of the same width between and separating each of said electrodes one from another.

6. A control lever switch as claimed in claim 2, in which the transmitter electrode is disc-shaped, second bearing means are provided between the control lever and the disc-shaped transmitter electrode, said second bearing means providing electrical insulation between the transmitter electrode and the control lever and enabling axial displacement and pivoting of the transmitter electrode relative to the control lever, a guide for the transmitter electrode formed as part of said second bearing means, and spring means biassing the transmitter electrode against the circuit board.

7. A control lever switch as claimed in claim 2, in which the bearing means for the control lever is formed as a universally pivotable spherical bearing, the switch including bearing support means for the spherical bearing, spring seating means on the control lever, and spring means between the bearing support means and the spring seating means, said spring means urging the control lever towards its central position.

8. A control lever switch as claimed in claim 7, in which said spring means comprises a coil spring, a sleeve is displaceably mounted on the control lever adjacent to the spherical bearing as a seat for the coil spring, said bearing support means has a flat surface section on the side adjacent to the sleeve against which a flat face of the sleeve adjacent to the spherical bearing bears and is movable, said coil spring is compressible in dependence upon the tilt of the control lever, and a cylindrical shoulder is provided on the sleeve and projects into the coil spring to act as a stop when it abuts said spring seating means, thereby defining a limit to the lateral displacement of the control lever.

9. A control lever switch as claimed in claim 7, which includes second bearing means between the transmitter electrode and the control lever and comprising a sleeve-type guide which carries the transmitter electrode and which is axially displaceable and pivotable relative to the control lever, and second spring means between the sleeve-type guide and said spring seating means, said second spring means being weaker than said first spring means.

10. A control lever switch as claimed in claim 6, wherein said input energising means includes a signal source comprising a wave oscillator, first connecting means between said signal source and the disc-shaped transmitter electrode, second connecting means between the control channels and said segmental electrodes, said control electrodes are connected to subsequent circuit means, and by means of said second connecting means directional signals corresponding to a proportion of the number of the segmental electrodes are fed to the control channels, said directional signals additionally being variable in respect to their magnitude by the tilting of the control lever by virtue of the change in the capacitive coupling consequent upon such pivoting of the control lever.

11. A control lever switch as claimed in claim 10, which includes four of said control electrodes formed as segmental electrodes and each connected to two control channels, rectifying and smoothing means connected to said control channels, and comparison means connected to said control channels, said two latter means providing both directional output signals and variable amplitude DC output signals.

12. An electrical control mechanism comprising:
a control lever;
bearing means supporting said control lever for universal pivoting movement;
a plurality of control electrodes arranged in a spaced array for operative association with said control lever;
a transmitter electrode carried by said control lever for movement thereby to selected positions relative to said plurality of control electrodes;
capacitive coupling means including dielectric means interposed between said transmitter electrode and said plurality of control electrodes for establishing a capacitive coupling therebetween; and
circuit means connected with said transmitter electrode and said plurality of control electrodes;
said control mechanism operating to effect an electrical control function by movement of said control lever to change the relative position between said transmitter electrode and said plurality of control electrodes.

* * * * *